United States Patent
Brooks et al.

(10) Patent No.: US 10,515,163 B2
(45) Date of Patent: Dec. 24, 2019

(54) SYSTEMS AND METHODS FOR IMPROVING VISUAL ATTENTION MODELS

(71) Applicant: 3M INNOVATIVE PROPERTIES COMPANY, St. Paul, MN (US)

(72) Inventors: Brian E. Brooks, St. Paul, MN (US); Brian J. Stankiewicz, Mahtomedi, MN (US); Brian L. Linzie, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 153 days.

(21) Appl. No.: 15/834,104

(22) Filed: Dec. 7, 2017

(65) Prior Publication Data

US 2018/0101629 A1    Apr. 12, 2018

Related U.S. Application Data

(63) Continuation of application No. 13/808,205, filed as application No. PCT/US2011/041995 on Jun. 27, 2011, now abandoned.

(60) Provisional application No. 61/362,017, filed on Jul. 7, 2010.

(51) Int. Cl.
| | |
|---|---|
| *G06F 17/10* | (2006.01) |
| *G06F 17/50* | (2006.01) |
| *G06T 7/11* | (2017.01) |
| *G06K 9/46* | (2006.01) |

(52) U.S. Cl.
CPC ....... *G06F 17/5009* (2013.01); *G06K 9/4623* (2013.01); *G06T 7/11* (2017.01); *G06T 2207/10024* (2013.01); *G06T 2207/30201* (2013.01)

(58) Field of Classification Search
CPC .................................................. G06F 17/5009
USPC .......................................................... 703/2
See application file for complete search history.

(56) References Cited

U.S. PATENT DOCUMENTS

| | | | |
|---|---|---|---|
| 6,670,963 B2 | 12/2003 | Osberger | |
| 8,442,328 B2 | 7/2013 | Stankiewicz | |
| 8,577,156 B2 | 11/2013 | Stankiewicz | |
| 2009/0012848 A1 | 1/2009 | Brooks | |
| 2009/0012927 A1 | 1/2009 | Brooks | |
| 2010/0017288 A1 | 1/2010 | Graham, II | |

FOREIGN PATENT DOCUMENTS

| | | |
|---|---|---|
| EP | 2141658 | 1/2010 |
| WO | WO 2010/039976 | 4/2010 |

OTHER PUBLICATIONS

Itti, "A saliency-based search mechanism for overt and covert shifts of visual attention", Vision Research, 2000, vol. 40, pp. 1489-1506.
Gao, "On the plausibility of the discriminant center-surround hypothesis for visual saliency", Journal of Vision, 2008, vol. 8, No. 7, pp. 1-18.

(Continued)

*Primary Examiner* — Hugh M Jones
(74) *Attorney, Agent, or Firm* — Sandra K. Nowak

(57) ABSTRACT

Systems and methods for improving visual attention models use effectiveness assessment from an environment as feedback to improve visual attention models. The effectiveness assessment uses data indicative of a particular behavior, which is related to visual attention allocation, received from the environment to assess relative effectiveness of the environment on influencing the particular behavior.

22 Claims, 12 Drawing Sheets

(56) References Cited

OTHER PUBLICATIONS

Itti, Models of Bottom-Up Attention and Saliency in Neurobiology of Attention, Elsevier, 2005, pp. 576-582.
Rothkopf, "Task and context Determine Where You Look", Journal of Vision, 2007, vol. 7, No. 14, pp. 1-20.
Torralba, Contextual Modulation of Target Saliency, Adv. in Neural Information Processing Systems, 14 (NIPS), MIT Press, 2001, 8 pages.
Navalpakkam, "Modeling the Influence of Task on Attention", Vision Research, 2005, vol. 45, pp. 205-231.
ISR for PCT/US2011/041995 dated Jan. 11, 2012, 3 pages.

SYSTEMS AND METHODS FOR IMPROVING VISUAL ATTENTION MODELS

CROSS REFERENCE TO RELATED APPLICATIONS

This application is a continuation of U.S. application Ser. No. 13/808,205, filed Jan. 3, 2013, now pending, which is a national stage filing under 35 U.S.C. 371 of PCT/US2011/041995, filed Jun. 27, 2011, which claims the benefit of U.S. Provisional Application No. 61/362,017, filed Jul. 7, 2010, the disclosure of which is incorporated by reference in their entirety herein.

BACKGROUND

A biological visual system is a capacity limited system in that it can only process a relatively small number of objects at any given time. This is true, despite the fact that there are many objects that may be visible at any given time. From the array of objects visible to a person, that person's visual system will only attend to, or process, one (or very few) objects at any given time. In addition, people can attend to an object while looking at it, which is overt attention, and people can attend to an object without looking at it, which is covert attention.

Understanding what attracts visual attention is a topic of research in psychology, neuroscience and computer science. This research has generated numerous studies directed toward understanding the behavior of human visual attention, as well as many computational models of visual attention. These computational models (sometimes called visual attention models, eye-gaze prediction models, attention models, or saliency models) attempt to simulate where, given visual stimuli (for example, a picture or a scene), a person will allocate his visual attention.

SUMMARY

Systems and methods for improving visual attentions models are disclosed. A visual attention model improvement system, consistent with the present invention, comprises a module for receiving visual representations of at least a portion of two environments, a module for receiving output generated by applying a visual attention model on the visual representations of the at least a portion of the two environments, an effectiveness assessment module, and a visual attention model accuracy analysis module. The two environments are different from each other on a visual dimension. The effectiveness assessment module assesses relative effectiveness of the two environments on influencing a particular human behavior based on data indicative of the particular human behavior received from the two environments, wherein the particular human behavior is inferentially related to attention allocation. The visual attention model accuracy analysis module compares the assessed relative effectiveness to the output generated by the visual attention model.

In one embodiment, a visual attention model improvement system comprises a module for receiving visual representation of at least a portion of an environment, a module for receiving output generated by applying a visual attention model on the visual representation of the at least a portion of the environment, an effectiveness assessment module, and a visual attention model accuracy analysis module. The effectiveness assessment module assesses relative effectiveness of the environment on influencing a particular human behavior based on data indicative of the particular human behavior received from the environment, wherein the particular human behavior is inferentially related to attention allocation. The visual attention model accuracy analysis module compares the assessed relative effectiveness to the output generated by the visual attention model.

In another embodiment, a system to modify a visual attention model for a group of environments is disclosed. The system comprises a module for receiving visual representations of at least a portion of one or more environments in the group of environments; a module for receiving output generated by applying the visual attention model on the visual representations of the at least a portion of the one or more environments; a module for assessing the relative effectiveness of the one or more environments on influencing the particular human behavior based on data indicative of a particular human behavior received from the one or more environments, wherein the particular human behavior is inferentially related to attention allocation; and a processing unit for modifying the visual attention model according to the comparison between the assessed relative effectiveness and the output generated by the visual attention model. Optionally, the processing unit associates the modified visual attention model with the group of environments and associates the modified visual attention model with the particular human behavior.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
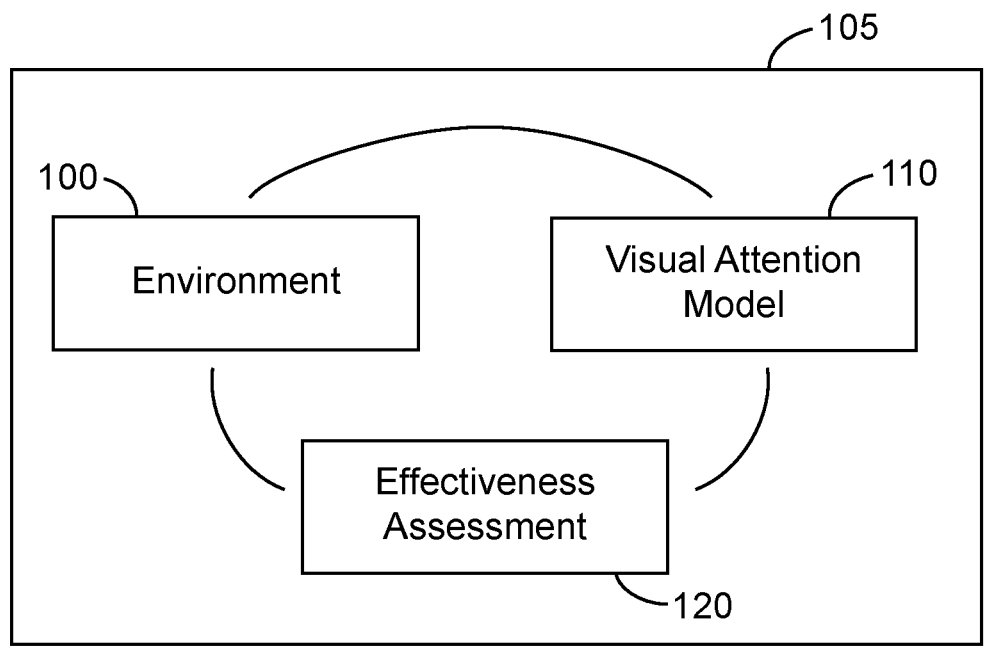
FIG. 1 is a block diagram of a visual attention model improvement system.

While visual attention models have been studied for many years, more recently they have been increasingly used for commercial purposes. As these uses have developed, questions remain as to the accuracy of the models and ways to effectively improve them, as a visual attention model is a simulation to visual attention that cannot perfectly model visual attention allocation of a viewer. When a biological visual system receives a visual input, a retinal image representation is formed. Generally speaking, visual attention operates as a two-stage process. Early-stage visual processing is based on low-level, non-volitional features, also referred to as bottom-up features, such as color, contrast, luminance, motion, orientation, and the like. Later, volitional features, also referred to as top-down features, such as spatial biases, prior-knowledge, tasks, expectations, goals, will influence the early-stage visual processing. The biological visual system processes the information combining both the bottom up visual features and the top-down influences to allocate visual attention at a specific object or region in the visual input.

A visual attention model (VAM) simulates neurological processes and psychological effects in a biological visual system. First, visual representation of a visual input, in a form consumable by a VAM, simulates a retinal image representation. Both bottom-up features and top-down effects may be simulated in a visual attention model. However, errors are likely introduced into visual representation of the visual input. For example, a human retinal may have different sensitivity to luminance from a digital camera. Additionally, the bottom-up features and the top-down effects simulated in the visual attention model are different from neurological processes and psychological effects in an actual visual system. Therefore, three potential sources of error are present in a visual attention model: the visual representation, simulation of bottom-up features, and simulation of top-down effects.

Improving modeling accuracy of visual attention models is important and necessary, to further the technology development in this area. People have conducted eye-tracking studies to record human fixation patterns to compare with patterns simulated by visual attention models. Eye-tracking studies measure a point of gaze, referred to as visual fixation, which is directly related to overt visual attention allocation. In other words, eye-tracking studies measures visual fixation, which is the location where a viewer is looking at while the viewer is in an environment. However, eye-tracking studies are difficult, invasive, and expensive. Indeed, eye-tracking studies are economically impractical in many situations, for example, such as a study in a nationwide digital signage system including signage displays allocated in hundreds of stores.

The present disclosure is directed to a system and method, for improving modeling accuracy of visual attention models, using data that is indirectly correlated to the accuracy of a model. This approach is referred to as an effectiveness assessment approach. When a viewer is in an environment, the viewer's visual attention to the environment may influence the viewer's decision. The viewer's behavior may reflect the viewer's decision. In some cases, the effectiveness assessment approaches may use data indicative of viewers' behavior, which is inferentially related to viewers' visual attention, to provide feedback to visual attention models. In some other cases, the effectiveness assessment approaches may use data indicative of viewers' behavior along with visual fixation measurement data to provide feedback to visual attention models.

In one embodiment, visual representations of at least a portion of two environments that differ from each other on a visual dimension are obtained. The environments are expected to influence a particular human behavior that is inferentially related to attention allocation in the environment and about which data can be collected. An output of a visual attention model for these two representations may be generated. From the collected data, the relative effectiveness of the two environments on influencing the particular human behavior can be assessed and used to modify the visual attention model if the assessment is inconsistent with the output generated by the visual attention model.

Visual dimensions are features that may be represented in a visual attention model. For example, visual dimensions may be bottom-up features, which are the particulars of a visual input, such as color, edges, luminance, faces, intensity, font, orientation, motions, distance from fovea, etc. As another example, visual dimensions may be top-down, volitional effects, such as spatial biases, prior-knowledge influences, task-based influences, and the like.

To better understand this disclosure, FIG. 1 illustrates an embodiment of a visual attention model improvement system 105. In this system, an environment 100 represents an area where a viewer is located, will be located and/or where a viewer may attend to an object of interest. An environment 100 may be any number of different areas, for example, a natural environment, such as a retail store, an outdoor scene, or a building and the like, or a digital environment that is created by a computer or a group of computers, such as a webpage, a video game, and the like.

The environment 100 may influence a particular behavior of visitors. For example, an exhibition in a museum may be designed to showcase a sculpture, so a particular behavior may be visitors' viewing the sculpture, or being close to the sculpture. In a store environment designed to promote sales of products, for instance, a particular behavior may be purchasing the products, or picking up the products. Another exemplary particular behavior is to follow a directional sign in a building, such as an 'exit' sign. In an environment of a webpage designed to highlight a product, the particular behavior may be opening a pop-up window containing product detailed description, viewing enlarged images, or adding the product to a virtual shopping-cart, for example.

Visual attention allocation in an environment is indirectly related to how effectively the environment influences a particular behavior. An environment may have a particular stimulus to be attended and a number of visual stimuli that are distracting. A particular behavior may be related to how likely an object of interest in an environment is attended. For example, when a piece of advertisement content is salient in an environment, viewers likely attend to the advertisement and possibly act on the advertisement, such as, purchasing an item that is advertised. As another example, when a directional sign is salient in an indoor environment, visitors likely see the sign and follow its direction. Therefore, the effectiveness of the environment on influencing viewers' particular behavior may indicate the attention allocation in an environment, for example, whether an object of interest is likely attended.

Visual attention model 110 may be used to evaluate whether an environment is properly designed to effectively influence a specified behavior according to its simulation of visual attention or saliency. Visual attention models (VAM) simulate the extent to which objects or regions in an environment differ with respect to the likelihood that they will attract visual attention. A VAM takes input of a visual representation of at least a portion of an environment, which is any form of input that is amenable to evaluation by a visual attention model, and may, for instance, be an image, a digital photograph, a virtual 3D scene, a webpage, a document, a set of visual parameters, or a video.

A visual attention model 110 generates an output indicating regions, objects, or elements that may receive visual attention in the environment. A visual attention model's disposition of an object refers to how a model of visual attention characterizes the relative saliency of an object within an environment. For example, some visual attention models will superimpose a trace line around predicted objects. The disposition of an object may be considered as "selected" (when traced) or "not selected" by the model. Other visual attention models will generate heat maps that may be superimposed over the image or viewed separately from the image. The disposition of an object is the degree to which the model has selected the object (or not selected the object). Some visual attention models may generate and assign a value to a particular object and/or region, referred to as a saliency number, with the value representing that object's saliency in relative terms. In the context of a saliency number, the disposition of the object may be the saliency number itself.

Some visual attention models may generate and assign a value to an object or region, referred to as a sequence number, representing the order that a viewer will attend to the object or region compared with other objects or regions. The disposition of the object may be the sequence number. Some visual attention models may generate and assign a value to an object or region, referred to as a probability number, representing the probability that an object or region will be attended in a given time period. The disposition of the object may be the probability number. An object has relative high saliency in an environment, according to a VAM output, when it is selected, or has a high saliency number, a high probability number, or a low sequence number compared with other objects in the environment.

In FIG. 1, an effectiveness assessment module 120 may assess how effectively the environment influences a particular behavior based on data indicative of then particular behavior received from an environment. This assessment may then be used to evaluate and improve visual attention models. In this context, the particular behavior may be inferentially related to attention allocation, but not directly related to attention allocation. That is, visual attention can be inferred from the assessed effectiveness. In one embodiment, an environment with higher effectiveness indicates that an object of interest is more likely to be attended in the environment than an environment with lower effectiveness.

In some cases, the particular behavior may be directly inferentially related to attention allocation, which means that the occurrence of the particular behavior indicates where visual attention is allocated. For example, a particular behavior of mouse-click indicates that visual attention is allocated at the position of the mouse, such as a button on a webpage, a link on a document, and the like. As an example, a particular behavior may be a mouse-click on a button on a webpage, and the effectiveness assessment module 120 may collect data on the number of clicks on the button. As another example, a particular behavior of a user touching on a touch panel indicates that visual attention is allocated at the position of the touch.

In some other cases, the particular behavior is indirectly inferentially related to attention allocation, which means that the occurrence of the particular behavior indicates where visual attention is likely allocated. In a particular embodiment, occurrence of a particular behavior indicates that an object of interest in an environment is likely attended to. However, a viewer may demonstrate the particular behavior even if the viewer does not attend to the object of interest. For example, a digital signage display presents an advertisement on an item in a store. People looking at the display may be influenced and purchase the advertised item, while some people may purchase the item without seeing the advertisement. For a particular behavior of viewers' purchasing a product, for instance, the effectiveness assessment module 120 may collect point-of-sale data. A product may be, for example, a particular item, items of a model of product, or items of a type of product. For a particular behavior of viewers' awareness of a product described on a webpage, the effectiveness assessment module 120 may collect surveys filled out by customers. As another example, for a particular behavior of people following a directional sign, the effectiveness assessment module 120 may use video data to analyze amount of traffic following the sign's direction. In some cases, the effectiveness assessment module 120 may collect data in a natural environment that is related to an environment expected to influence a particular behavior. For example, the effectiveness assessment module 120 may collect data in a store while a sign to promote sales of a product is outside the store.

In some embodiments, the effectiveness assessment module 120 may collect data that is indicative of the particular behavior but not a measurement of the particular behavior. In an exemplary embodiment, for a particular behavior as viewers' intention to purchase a product, the effectiveness assessment module 120 may collect data utilizing sensor technology on the number of people who are close to the product or the number of times that the product is picked up. In some cases, for a particular behavior of viewers' awareness of a product described on a webpage, the effectiveness assessment module 120 may gather data on the length of time people visit the webpage, the amount of purchases originated from this webpage, or the number of visits to a webpage with further information on the product directed from the webpage. In an exemplary embodiment, for a particular behavior of people following an 'exit' sign, the effectiveness assessment module 120 may collect data on the length of time for people to exit a building in a fire drill. In one other exemplary embodiment, for a particular behavior of people's using a service advertised on a TV program, the effectiveness assessment module 120 may gather data on the number of customers calling the phone number shown in the TV program, or the volume of service requested.

In one particular embodiment, the effectiveness assessment module 120 may collect data from two comparable environments, which are different from each other on an aspect of interest, and determine relative effectiveness of the two environments. Thus, the relative effectiveness may indicate the impact of the aspect of interest while impacts of other aspects of the environments are negated.

The effectiveness assessment approach of the present disclosure is advantageous over eye-tracking studies in many aspects. First, the effectiveness assessment approach may gather data readily available, for example, such as point-of-sale data, survey data, or the amount of time viewers spent on a webpage. Second, the effectiveness assessment approach may be conducted in situations that are impractical for eye-tracking studies. For example, for an outdoor environment having a billboard with a restaurant advertisement erected by a highway, it is impossible to gather eye-tracking data while people drive by the billboard. However, the effectiveness assessment approach may collect and analyze data on the number of visits to the restaurant while the billboard is displaying, or while one version of a billboard is being displayed as compared to another. Third, the effectiveness assessment approach may gather data indicating viewers' overt attention where viewers attend to an object of interest via looking at it and covert attention where viewers attend to the object without looking at it, while eye-tracking studies cannot gather data on covert attention.

Figure 2:
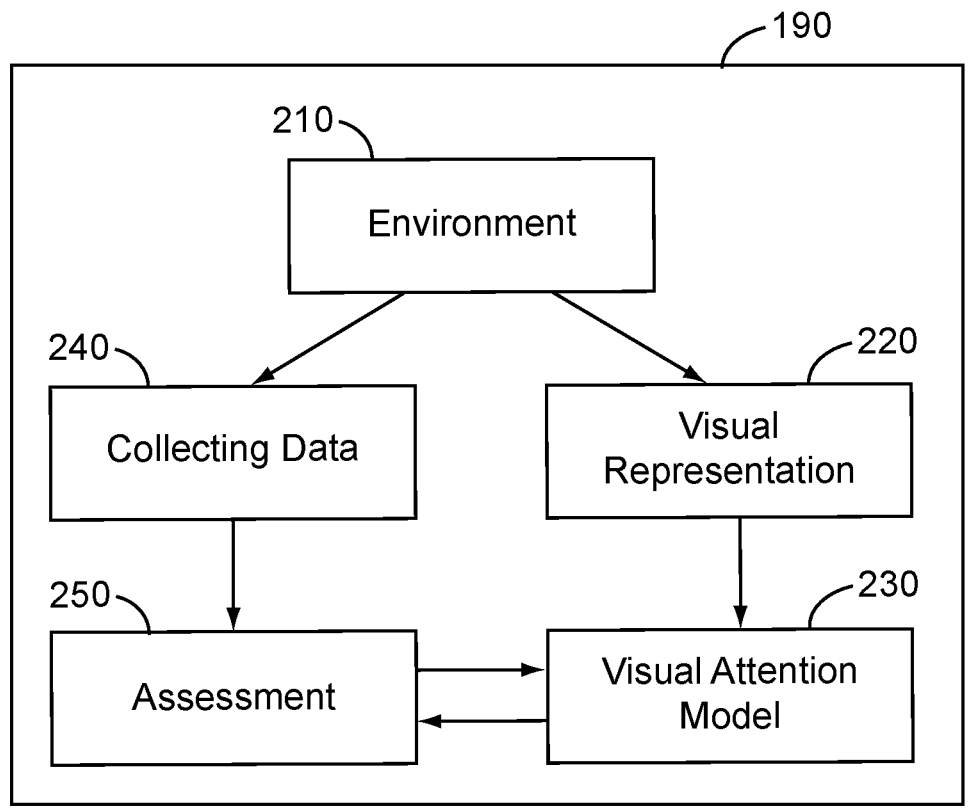
FIG. 2 is a functional flow diagram for an exemplary visual attention model improvement system.

FIG. 2 is a functional flow diagram for an exemplary visual attention model improvement system 190. An environment 210 may be an instance or sample of an actual environment, which is either a natural environment or a digital environment, or a class of physical environments. An environment may be, for example, a webpage, a banner within a webpage, a traffic scene, a photograph, a virtual 3D scene, a store having a digital signage display, a lobby with a sign, a video of a thirty-second commercials, an instrumentation panel with buttons, a webpage with a piece of dynamic advertisement, etc. Alternatively, an environment may be a design of a display environment that does not physically exist. As another example, two environments could be two instances of the same physical environment at different times of day, for example, an environment in the afternoon and one at night.

A visual representation 220 of at least a portion of the environment 210 is used as an input to a visual attention model. The visual representation 220 may be, for example, a set of visual parameters, an image, a set of images that each image represents an aspect of the environment, a digital photograph, a virtual 3D scene, a webpage, a document, a video, and the like.

Visual attention model (VAM) 230 generates a modeling output for the visual representation 220. The modeling output may be represented, for example, by a saliency map, trace lines, saliency numbers, sequence numbers, probability numbers, and the like.

The environment 210 may influence a specified behavior, for example, such as following a sign, making a purchase, or visiting an exhibition. Data indicative of the specified behavior will be collected from the environment 210 (block 240). Here, data indicative of the specified behavior may be, for instance, point-of-sale data, number of visits, survey data, motion sensor data, or video data. The effectiveness of the environment 210 will be assessed based on the collected data (block 250). The assessed effectiveness will be compared with the modeling output and provide feedback to visual attention model 230. The visual attention model 230 may be modified based on the feedback. For example, if a relative saliency for a target element is higher than distractive elements in an environment, while viewers attending to the target element are likely to be influenced on a specified behavior, the effectiveness of the environment shall be high. However, based on collected data indicative of the specified behavior, the assessed effectiveness is low such that it is inconsistent with the VAM output. The visual attention model may be modified such that its modeling output is consistent with the assessed effectiveness.

In a simplified embodiment, two environments differ in a visual dimension represented in a visual attention model. The two environments may influence a particular human behavior. The particular human behavior may be related to whether a person attends to an object of interest in the environments. Visual representations of at least a portion of the two environments may be generated or selected from a library of visual representations. Modeling outputs for the visual representations may be generated by the VAM. Data indicative of the particular human behavior may be gathered from each of the two environments. The data may be obtained from direct measurement of the particular human behavior, measurement data indicative of the particular behavior, or a data repository containing data indicative of the particular behavior. Then, the effectiveness of the environment on influencing the particular human behavior is assessed based on the gathered data. The relative effectiveness of the two environments is compared with the modeling outputs. The VAM may be modified based on the comparison.

In an exemplary embodiment, saliency numbers for objects or regions in the environment may be generated by the VAM. The relative effectiveness may be compared with the saliency number of the same object of interest in the two environments, environment A and environment B, for example. If the saliency number of the object in environment A is close to the saliency number of the display object in the environment B, but the assessed effectiveness of environment A is higher than the assessed effectiveness of environment B, the relative effectiveness of the environments is inconsistent with the VAM output. The visual attention model may be modified to generate modeling output such that the saliency number of the object in environment A is higher than the saliency number in environment B.

In one embodiment, if the two environments differ from each other on one visual dimension but are similar on other visual dimensions, the visual attention model may be modified on an aspect related to the visual dimension on which the two environments differs. For example, one environment is a webpage of green background with a banner of a lake resort, and the other environment is a webpage of orange background with the same banner and similar to the webpage of green background in other visual dimensions and contents. In this example, the visual representations of the two environments may be the two webpages. Both webpages are designed to attract viewers to go to a lake resort website, and the number of visits to the lake resort website directed from the webpage is recorded. The banner has a similar saliency number on both webpages, for example, based on the analysis of the visual attention model. However, the recorded number of visits to the website indicates that more visits are directed from the webpage with orange background. A parameter related to the background color in the visual attention model may be modified to generate output indicating the banner has higher saliency in the webpage with orange background.

Visual Attention Model Improvement System

Figure 3:
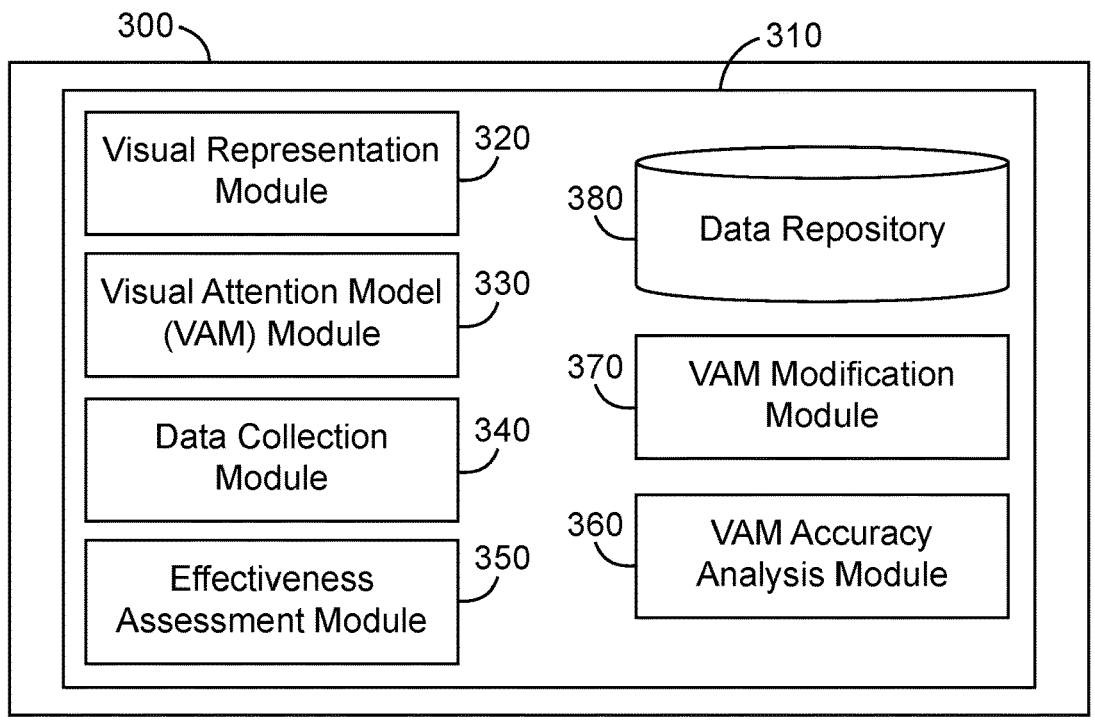
FIG. 3 is a functional module diagram of an exemplary visual attention model improvement system.

FIG. 3 is a functional module diagram of an exemplary visual attention model (VAM) improvement system 300, which is a system for improving the visual attention model. Visual attention model improvement system is, in the embodiment shown in FIG. 3, within computer system 310. Computer system 310 may be any general purpose or application-specific computer or device. It may be a stand-alone computer, or a plurality of networked computers or devices. Further, computer system 310 may include, for instance, a handheld computer, digital camera, or a tablet PC, or even a cellular telephone. Computer system 310, in one embodiment, has various functional modules (not shown in FIG. 3) that comprise an operating system. Such an operating system facilitates the visual attention model improvement system's access to the computer system's resources. Computer system 310 may have a processor and memory, and various traditional input/output interfaces.

In one embodiment, visual representation module 320 may generate a desired number of visual representations of a portion of environments, which may be designed to achieve a visual goal or may have an impact on a specified behavior. For example, visual representation of at least a portion of an environment may be one or more photographs taken from the environment or a video recorded from the environment. In another embodiment, visual representation module 320 may select a desired number of visual representations of a portion of environments from a data repository storing visual representations of environments. In one particular embodiment, visual representation module 320 may select or generate environments that may differ on a visual dimension. For example, visual representation module 320 may select pictures of two store settings, where each store setting has a digital signage display and the display content in one store is different from the display content in another store. The visual representation module 320 is discussed further below.

Visual attention model (VAM) module 330 is any embodiment of any visual attention model or combination of models. The VAM module 330 takes the input of a visual representation of at least a portion of an environment and generates a modeling output. Visual attention model module 330 is shown in FIG. 3 as part of visual attention model improvement system 300, but visual attention model module 330 in another embodiment operates as a stand-alone computer process or even as a service provided over any type of computer network (such as the World Wide Web) at a remote computer. Visual attention model module 330 will be discussed further below.

An optional data collection module 340 may be included in a VAM improvement system. Data collection module 340 collects data indicative of a specified behavior from an environment. In some cases, the collected data may be selected from a data repository, or recorded from the environments. In an environment of a store having a digital signage display in which the environment, for example, the collected data may be point-of-sale data of a product when the digital signage display is presenting an advertisement of the product. For an exhibition layout designed to promote viewing of an item, for example, the collected data may be sensor data on the number of people visiting the item, or the number of people passing an area close to the item. As another example, to evaluate a behavior of following a sign or a group of signs, the collected data may be the amount of time for viewers moving from a starting location to a designated location. Alternatively, to evaluate a behavior of following a traffic sign or a group of traffic signs, which are designed to reduce accidents in a highly congested area, the collected data may be the number of accidents. In addition, to evaluate people attending to a piece of content on a webpage, the collected data may be the number of visits to a website directed from the piece of content on the webpage.

Data collection module 340 may collect data in accordance with experiment design principle. On a digital signage network, data collection module 340 may utilize techniques described in detail in U.S. Patent Application Publication No. 2010/0017288, entitled "Systems and Methods for Designing Experiments," U.S. Patent Application Publication No. 2009/0012848, entitled "System and Method for Generating Time-slot Samples to Which Content May be Assigned for Measuring Effects of the Assigned Content," and U.S. Patent Application Publication No. 2009/0012927, entitled "System and Method for Assigning Pieces of Content to Time-slots Samples for Measuring Effects of the Assigned Content," which are incorporated herein by reference in entirety.

Based on data gathered in data collection module 340, effectiveness assessment module 350 determines relative effectiveness of an environment on influencing the specified behavior. Given two environments (environment A and environment B), for example, environment A and environment B may be the same museum show room but the location of a displayed item is changed. The effectiveness of environment A is higher than the effectiveness of environment B, for instance, if the number of people visiting the displayed item at environment A per unit duration is more than the number of people visiting the displayed item at environment B per unit duration. As another example, environment A and environment B may be two of a same chained stores, each having a digital signage display playing an advertisement on a designer bag, while the advertisements on the two signage displays differ in the image size of the designer bag. The effectiveness of environment A is higher than the effectiveness of environment B, for instance, if the amount of sales of the advertised item from environment A is higher than the amount of sales from environment B. As another example, the effectiveness of environment A is higher than the effectiveness of environment B if the amount of time to finish a transaction online in environment A is shorter than the amount of time at environment B. Here, environment A and environment B may be two webpages for people performing a same transaction.

In some cases, the effectiveness assessment module 350 may quantify the relative effectiveness. For example, the relative effectiveness of two environments influencing a specified behavior may be the ratio of number of visits from two environments, the ratio of amount of sales from two environments, the reverse ratio of the length of time from two environments, and so on. In some cases, the effectiveness of an environment on influencing more than one particular behavior may be evaluated by the effectiveness measurement module 350. For example, the effectiveness measurement module 350 may use data indicative of users' purchasing a product in addition to data indicative users' being close to the product.

VAM accuracy analysis module 360 may compare relative effectiveness generated by the effectiveness assessment module 350 and modeling output generated by the visual attention model module 340. In an exemplary embodiment, the modeling output is a saliency number of an object of interest in an environment. In some cases, the modeling output is consistent with the relative effectiveness of the environments if the ratio of the saliency number of the object of interest in environment A and environment B is equivalent to the ratio of the relative effectiveness of environment A and environment B, such that $$\frac{Saliency(environment\ A)}{Saliency(environment\ B)} = \frac{Effectiveness(environment\ A)}{Effectiveness(environment\ B)}$$

If the ratio of saliency is different from the ratio of effectiveness, the VAM may be modified.

In some other cases, the relative effectiveness of a placebo environment (environment P), which is an environment with no influence on the specified behavior, is also determined by the effectiveness assessment module 350. An accuracy indicator may be determined by the following equation, $$Accuracy\ Indicator = \frac{Effectiveness(environment\ A) - Effectiveness(environment\ P)}{Effectiveness(environment\ B) - Effectiveness(environment\ P)}}{Saliency(environment\ A)/Saliency(environment\ A)}$$

The VAM accuracy analysis module 360 is described further below.

VAM modification module 370 is the visual attention module modification module. VAM modification module 370 modifies aspects of the visual attention module's parameters or architecture. This modification may be accomplished in many ways depending on the implementation of the visual attention model module 340. For example, visual attention model module 340 may itself support function calls that modify aspects of how the visual attention module works. In one embodiment, visual attention model module 340 may support a function call that modifies a weight factor related to certain visual dimension represented in a VAM (luminance, for example). In another embodiment, if the visual attention model module is invoked via command line, various switches could be employed to change variables that are within the visual attention model module. Alternatively, if the visual attention model module 340 is embodied in a script or programming code, the VAM modification module could modify the script or programming code itself. In another embodiment, the entire visual attention model may be replaced by another visual attention model. The particular ways in which the VAM modification module 370 modifies the visual attention model module 340's underlying visual attention model (or the application of such a model to a scene) is discussed further below. In some embodiments, VAM accuracy analysis module 360 and VAM modification module 370 may operate on a separate server or as a service provided over a computer network.

Data repository 380 handles data storage needs of the visual attention model improvement system 300. In some cases, visual representations of at least a portion of environments may be stored in the data repository 380. Data indicative of a specified behavior may also be stored in the data repository 380. Among other things, effectiveness assessment for each environment may be stored in the data repository 380. In one embodiment, each group of environments may have its own set of parameter for a visual attention model. In another embodiment, each environment may have its own set of parameter for a visual attention model. In these embodiments, data repository 380 may store the parameter sets.

Data repository 380 may be any computer memory. For example, it may be random access memory, a flat file, a XML file, or one or more database management systems (DBMS) executing on one or more database servers or a data center. A database management system may be a relational (RDBMS), hierarchical (HDBMS), multidimensional (MDBMS), object oriented (ODBMS or OODBMS) or object relational (ORDBMS) database management system, and the like. Data repository 380, for example, may be a single relational database such as SQL Server from Microsoft Corporation. In some cases, data repository 380 may be a plurality of databases that may exchange and aggregate data by data integration process or software application. In an exemplary embodiment, part of the data repository 380 may be hosted in a data center.

Figure 4:
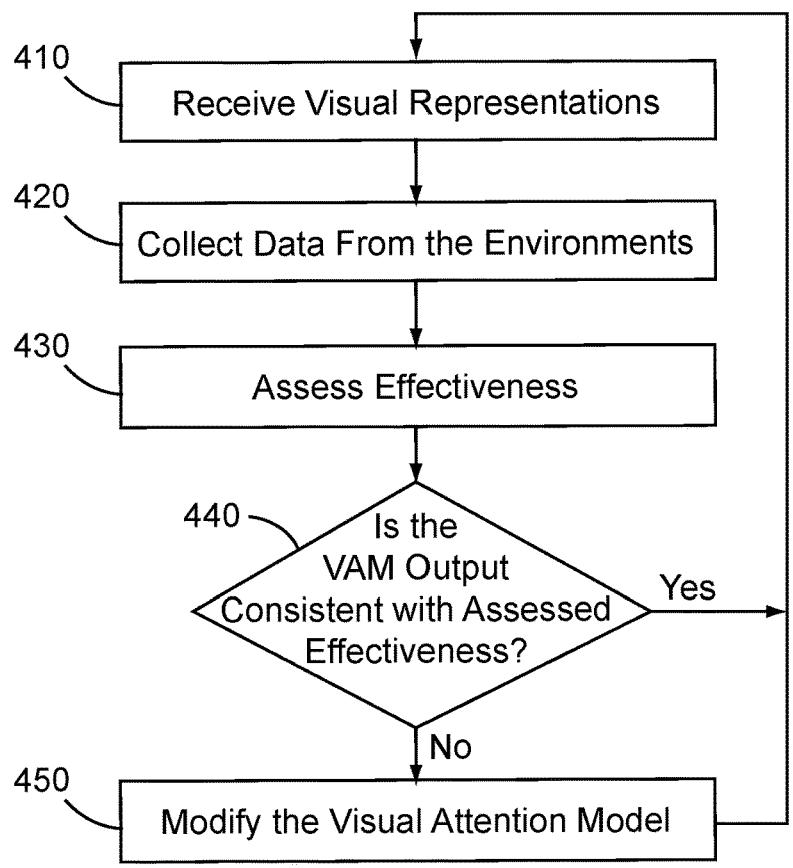
FIG. 4 illustrates an exemplary flowchart of improving visual attention models.

FIG. 4 illustrates an exemplary flowchart of improving visual attention models. Initially, visual representations of at least a portion of two environments are received (step 410). In some cases, visual representations of more than two environments may be used. In another embodiment, a placebo, which is visual representation of an environment with no impact on the particular behavior, is received. Next, data indicative to a particular behavior that is related to visual attention allocation is collected from the two environments (step 420). The collected data are used to assess relative effectiveness of the two environments on influencing the particular behavior (step 430). The relative effectiveness of the two environments will be compared with the modeling output generated by applying the VAM on the visual representations (step 440). If the modeling output is not consistent with the assessed relative effectiveness, the model may be modified (step 450).

Figure 5A:
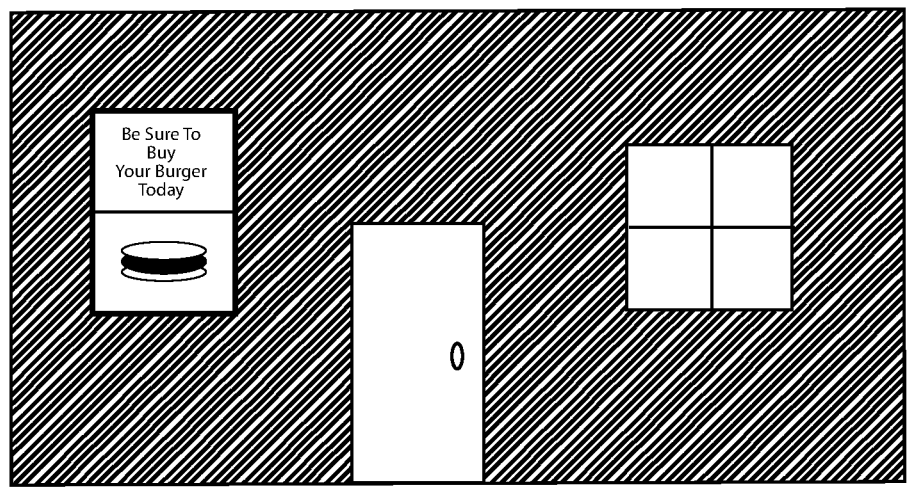
FIG. 5A and FIG. 5B show two exemplary environments differing on edge.
Figure 5B:
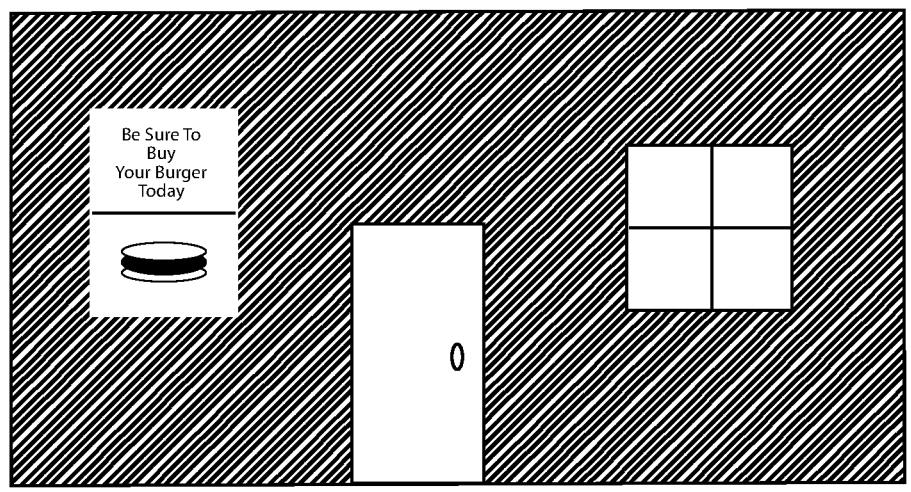

For example, visual representations of two environments, environment A and environment B, as shown in FIG. 5A and FIG. 5B, are simplified store environments having digital signage displays each playing a burger advertisement. These two environments are similar on all visual dimensions such as color, luminance, and faces, except on edges (the border around the display content). The modeling output generated by a VAM is saliency numbers. The saliency number of the burger advertisement display in both environments is similar. That is, according to the visual attention model, the difference on edges does not affect the relative saliency of the content. Point-of-sale data of burger in the two environments is gathered to determine how effectively the two environments influence people on buying burgers. The point-of-sale data collected from environment A, however, is higher than the point-of-sale data collected from environment B. Therefore, the modeling output is inconsistent with relative effectiveness of the two environments indicated by the point-of-sale data. The visual attention model may be modified accordingly.

Visual Attention Models

Figure 6:
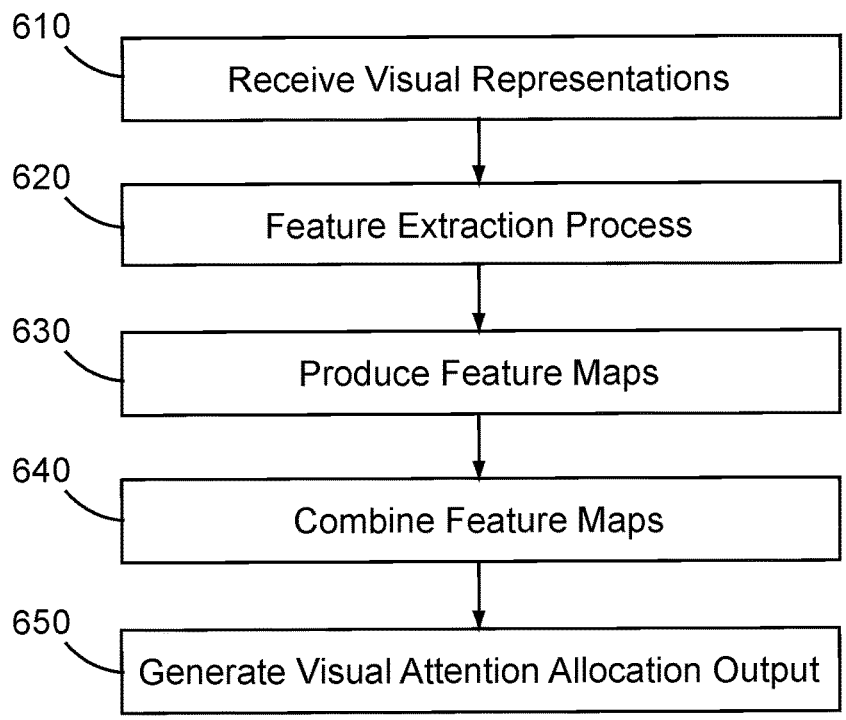
FIG. 6 illustrates an exemplary flowchart of a bottom-up visual attention model.

One basic methodology of visual attention models is represented in FIG. 6, which is proposed by Itti, L. & Koch, C. (2000), *A saliency-based search mechanism for overt and covert shifts of visual attention*, Vision Research, vol. 40, pages 1489-1506. At a high level, FIG. 6 shows how to generate modeling output of visual attention by assessment of bottom-up features, or referred as low-level features, such as color, motion, luminance, edges, etc. which serve as building blocks of the visual representations mediating some aspects of human vision. First, a visual representation of a scene, for example, a digital photograph, is provided to a computer-implemented version of the Itti and Koch model (step 610). Next, a feature extraction process analyzes the digital photograph for colors, intensity, orientations, or other scene cues, such as motion, junctions, terminators, stereo disparity, and shape from shading (step 620). The feature extraction process yields a plurality of feature maps (step 630), which are combined to produce a saliency map (step 640). In the case of the Itti and Koch model, saliency numbers of regions and/or objects in the scene are computed based on normalized feature maps. The saliency data may be provided to a user as a rendering of the original digital photograph with the "brightest" objects being to which the model has predicted visual attention will be next allocated. The saliency numbers is the output of the visual attention model (step 650).

Itti and Koch's model is representative of a bottom-up visual attention model, in that it makes its predictions based on analysis of the particulars of the scene. Other bottom-up visual salience models are described in these references: D. Gao, V. Mahadevan and N. Vasconcelos (2008), *On the plausibility of the discriminant center-surround hypothesis for visual saliency*, Journal of Vision, 8(7):13, 1-18.

Figure 7:
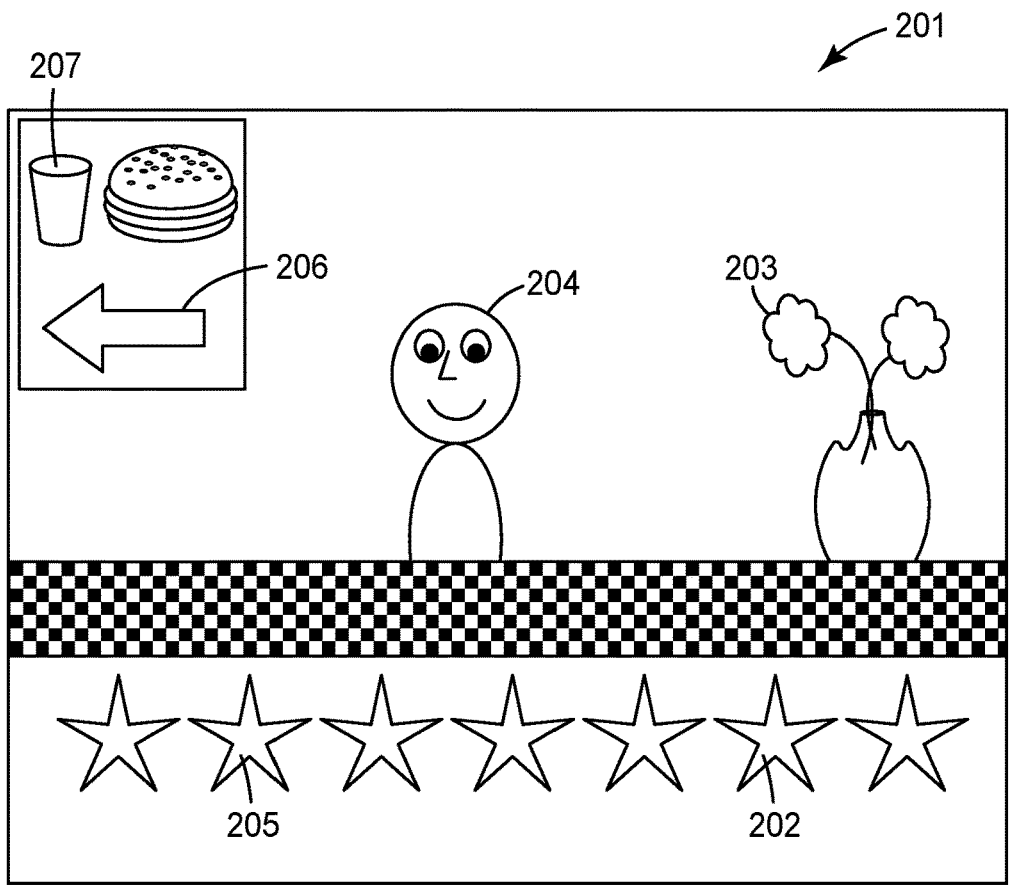
FIG. 7 is an artist's rendering of an environment.

FIG. 7 is an artist's rendering of a scene 201 that could be provided to a visual attention model such as Itti and Koch. It is a simplified scene included here for illustrative purpose only; in practice the scenes are often actual digital photographs, or videos, and are much more complex. FIG. 7 includes a number of objects within the scene, such as the star 202, flower 203, face 204, star 205, arrow 206, and cup 207.

Figure 8A:
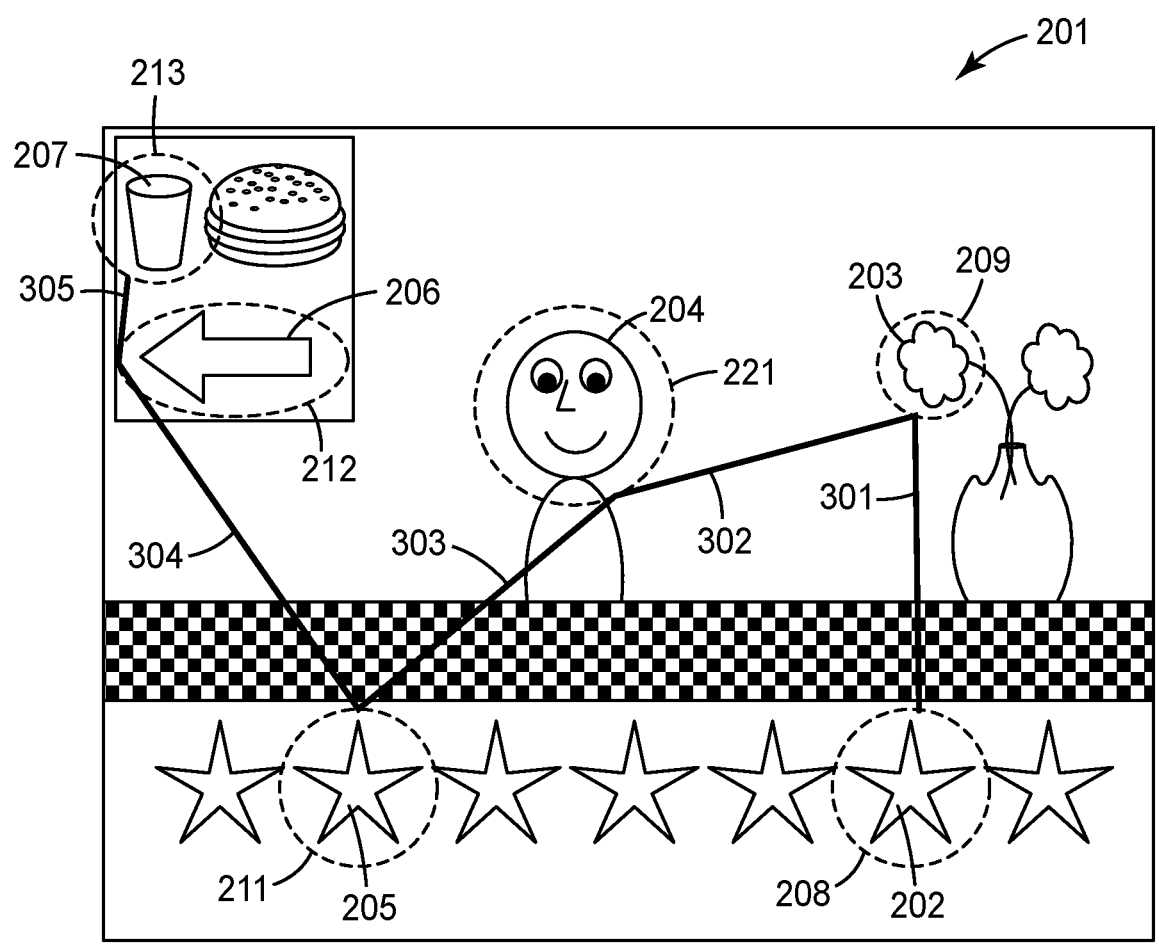
FIG. 8A is an exemplary modeling output generated by a visual attention model on the artist's rendering in FIG. 7.

FIG. 8A is an exemplary modeling output generated by a visual attention model on the artist's rendering in FIG. 7. The highlighted (and in this illustration, encircled) objects are those that the model predicts to be visually salient. For example, star 202 is in this figure within highlight border 208; flower 203 is within border 209; face 204 is within border 221; star 205 is within border 211; arrow 206 is within border 212; and cup 207 is within border 213. Thus the model in this instance has determined six objects that are, relative to other objects, more visually salient. This particular model also predicts how attention will move among the objects determined to be above some visual saliency threshold. For example, visual attention pathway 301, 302, 303, 304, and 305 show a predicted visual attention pathway.

Figure 8B:
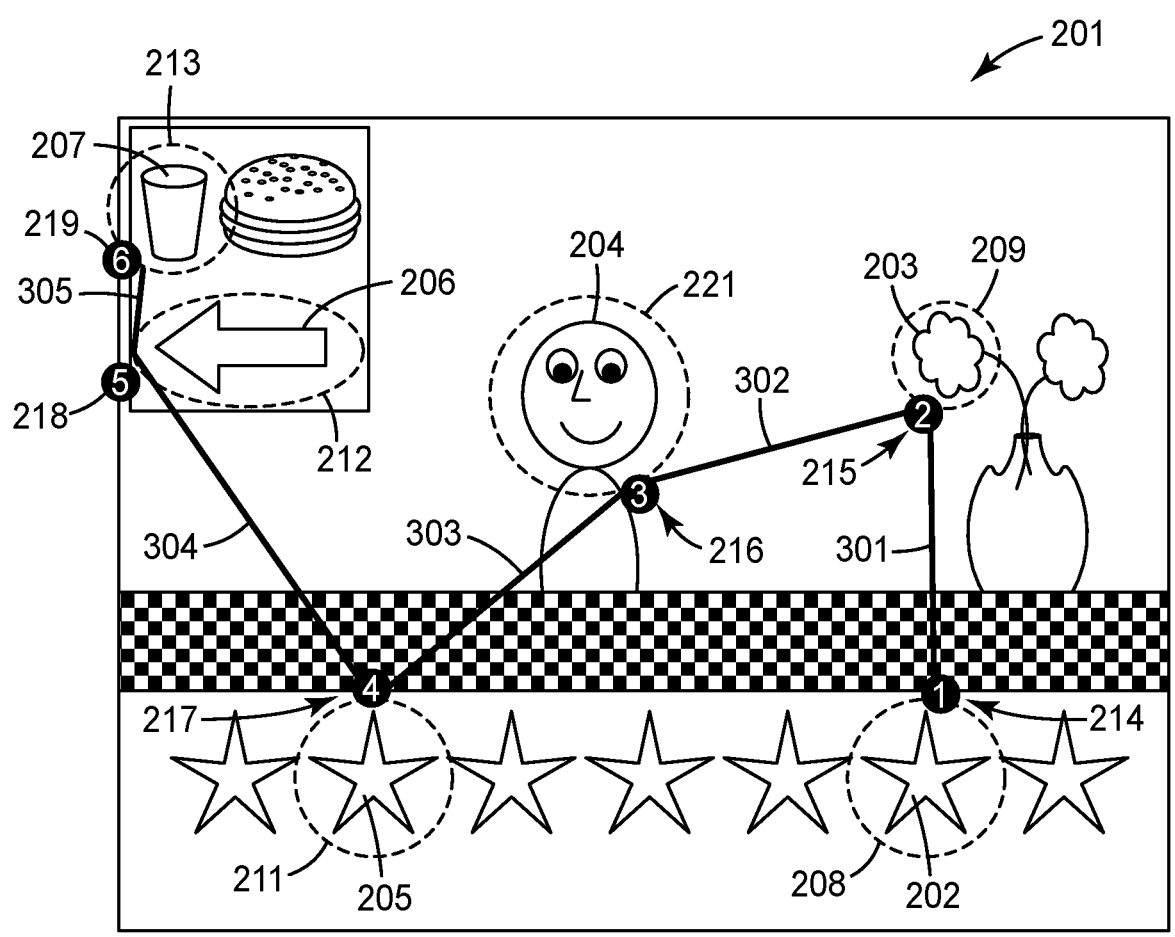
FIG. 8B is an exemplary modeling output generated by a visual attention model on the artist's rendering in FIG. 7.

FIG. 8B is another exemplary modeling output generated by a visual attention model on the artist's rendering in FIG. 7. In addition to what is shown in FIG. 8A, FIG. 8B includes the sequence of predicted visual attention. For example, star 202 is labeled "1" (attention sequence number 214), and flower 203 is labeled "2" (attention sequence number 215) and so forth.

Besides bottom-up models, there is another class of models referred to as top-down models of visual attention. In contrast to bottom-up models, these models influence the attention allocation with spatial bias (for example, 'F' pattern bias for webpage and center bias for display), an explicit task (for example, avoiding obstacles and collecting objects), or prior knowledge of the world that will influence where attention will be allocated during a specific search task (for example, chairs tend to be on the floor and not on the ceiling). This knowledge (both task-based and prior-knowledge) is used in conjunction with the bottom-up features to direct attention to objects within the observed scene. Some exemplary top-down models are described in Rothkopf, C. A., Ballard, D. H. & Hayhoe, M. M. (2007), *Task and context Determine Where You Look*, Journal of Vision 7(14):16, 1-20; and also in Torralba, A., *Contextual Modulation of Target Saliency*, Adv. in Neural Information Processing Systems 14 (NIPS), (2001) MIT Press, 2001. For example, Torralba's model of visual attention has prior knowledge about the features that comprise a particular type of object and information about the absolute and relative locations of these objects within the scene. This prior knowledge provides "top-down" influences on searching for specific targets within a scene.

The art has evolved to include hybrid visual attention models that have features of both bottom-up and top-down design, and adapted for differences in the types of visual representations the models will be exposed to (for example video versus still images, outdoor images versus web pages, and so forth).

An example of hybrid visual attention model is described in by Navalpakkam, V. & Itti, L. (2005), *Modeling the Influence of Task on Attention*, Vision Research, vol. 45, pages 205-231. This model receives task definition, determines task-relevant entities, and predicts visual attention allocation by biasing the attention system with task relevance.

Figure 9:
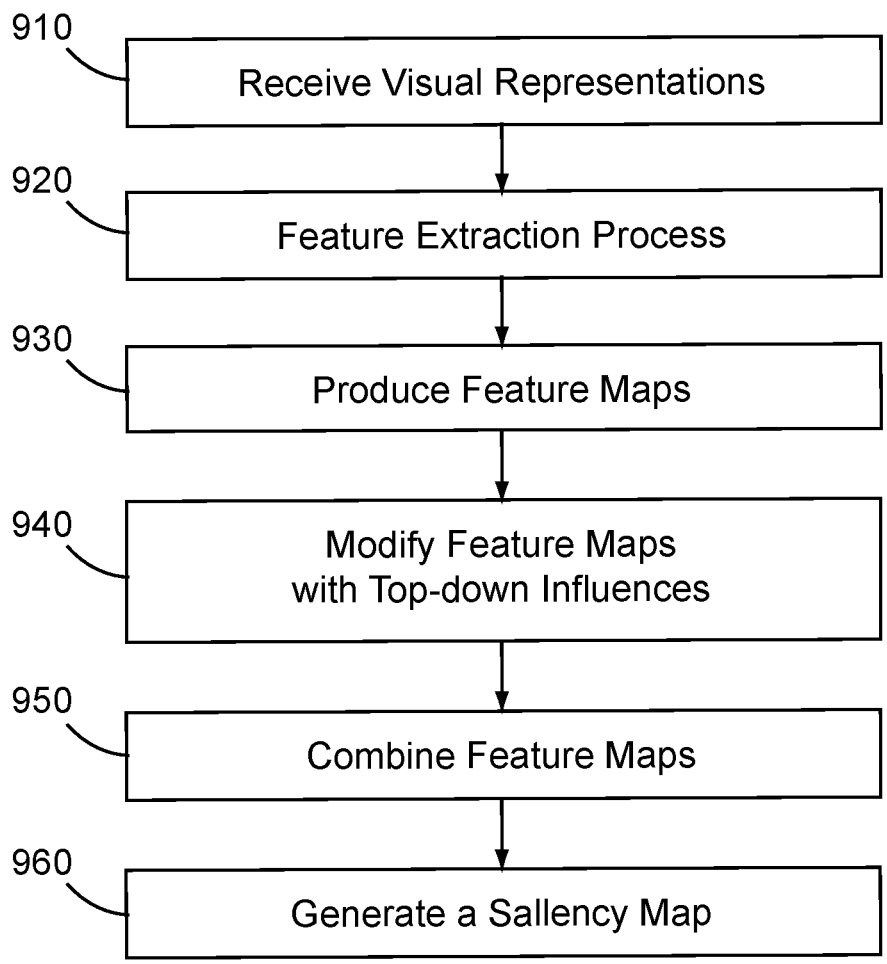
FIG. 9 illustrates an exemplary flowchart of a hybrid visual attention model.

FIG. 9 is an exemplary flowchart of a hybrid visual attention model illustrating the functional steps. First, a visual representation is provided to a hybrid visual attention model (step 910). Next, a feature extraction process analyzes the visual representations for colors, intensity, orientations, or other scene cues, such as motion, junctions, terminators, stereo disparity, and shape from shading (step 920). The feature extraction process yields a plurality of feature maps (step 930). The feature maps are modified with top-down influences, such as task-relevance, spatial bias, prior-knowledge influence (step 940). Then, the feature maps are combined to produce a saliency map (step 950). Saliency numbers of regions and/or objects in the scene are computed based on normalized feature maps. The saliency numbers is the output of the hybrid visual attention model (step 960).

Visual Representation Module

Figure 10:
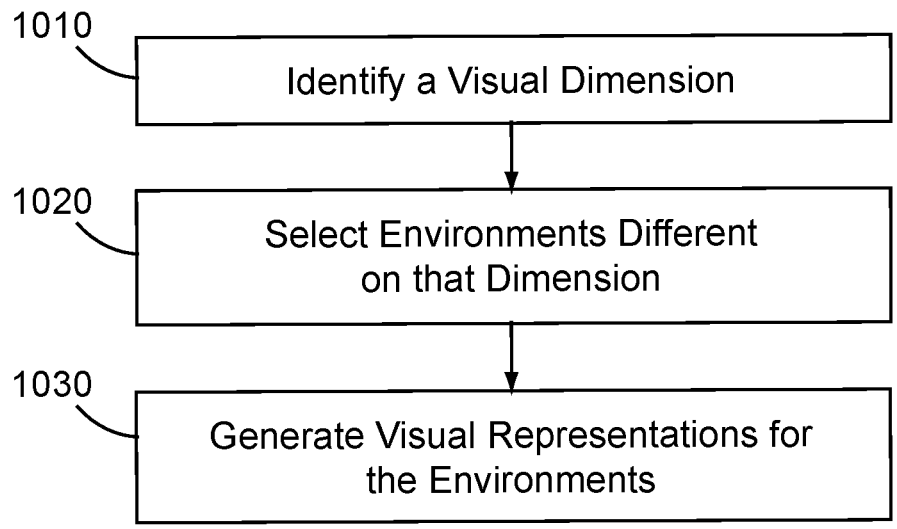
FIG. 10 is an exemplary flowchart of a visual representation module.
Figure 11A:
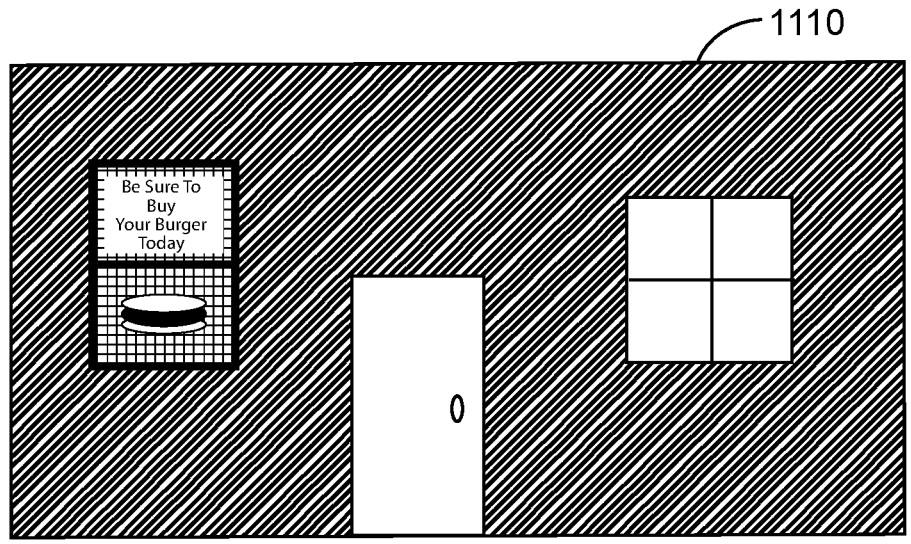
FIG. 11A and FIG. 11B illustrate two exemplary environments different from each other on luminance.
Figure 11B:
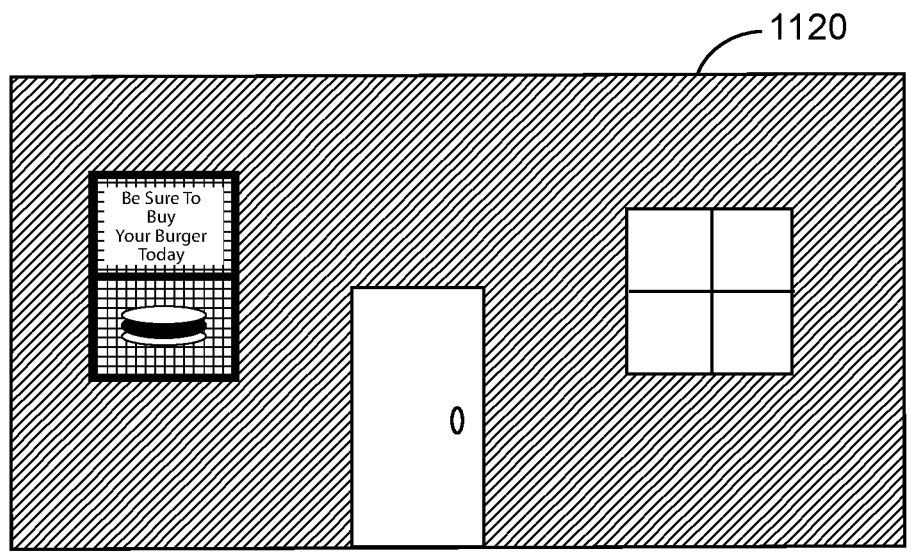

Visual representation module generates or selects visual representations of at least a portion of one or more environments as input to a visual attention model. FIG. 10 is an exemplary flowchart of visual representation module. Initially, the module identifies a visual dimension represented in a visual attention model for evaluating the accuracy of the model on the dimension, such as brightness (step 1010). Next, one or more environments that are different on the visual dimension are selected (step 1020). Visual representations for the one or more environments are generated (step 1030). FIG. 11A and FIG. 11B illustrate two simplified environments that are different from each other on luminance, for example, two fast-food restaurants. The luminance of environment 1120 is higher than the luminance of the environment 1110.

Figure 10A:
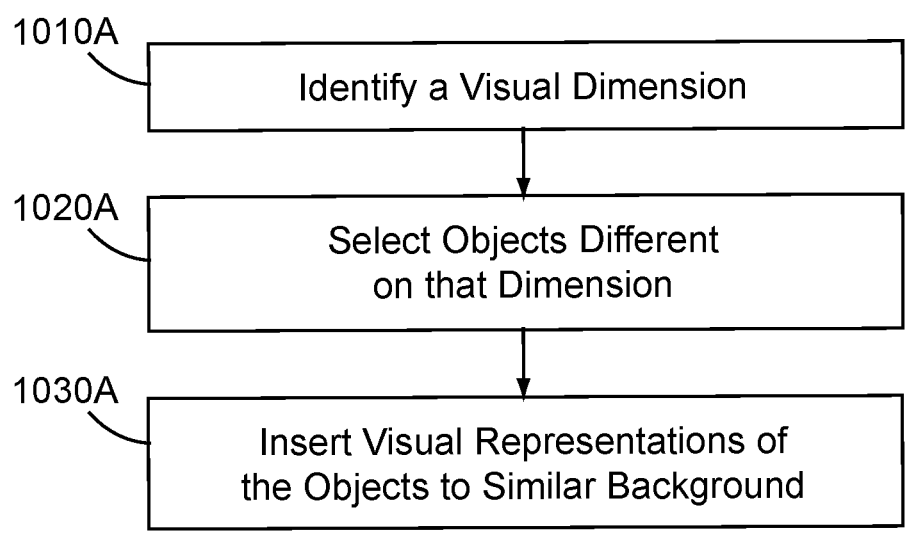
FIG. 10A is another exemplary flowchart of a visual representation module.

In one embodiment, a visual representation module may insert visual representations of one or more objects into a same or similar background to generate visual representations of two environments. Here, a background may be a picture of a store, a computer game background, or a webpage. FIG. 10A illustrates another exemplary flowchart of visual representation module. First, a visual dimension is identified (step 1010A). Next, one or more objects that differ on the visual dimension are selected or designed, such as a red apple and a green apple (step 1020A). Visual representations of the one or more objects are inserted on similar background (step 1030A). Visual representations of one or more environments are generated. FIG. 5A and FIG. 5B illustrates two pieces of display objects different from each other on edges, which are displayed in similar background. FIG. 5A and FIG. 5B may be generated by inserting visual representations of the display objects in an image of the background. In some cases, similar background may be stores of same franchise chain that are similar on floor layouts and decorations.

In some cases, visual representations of the one or more environments may be selected from a data repository based on the same criteria illustrated above, for example, one or more environments differing on a visual dimension, or similar background inserted with one or more objects differing on a visual dimension.

VAM Accuracy Analysis Module

Figure 12:
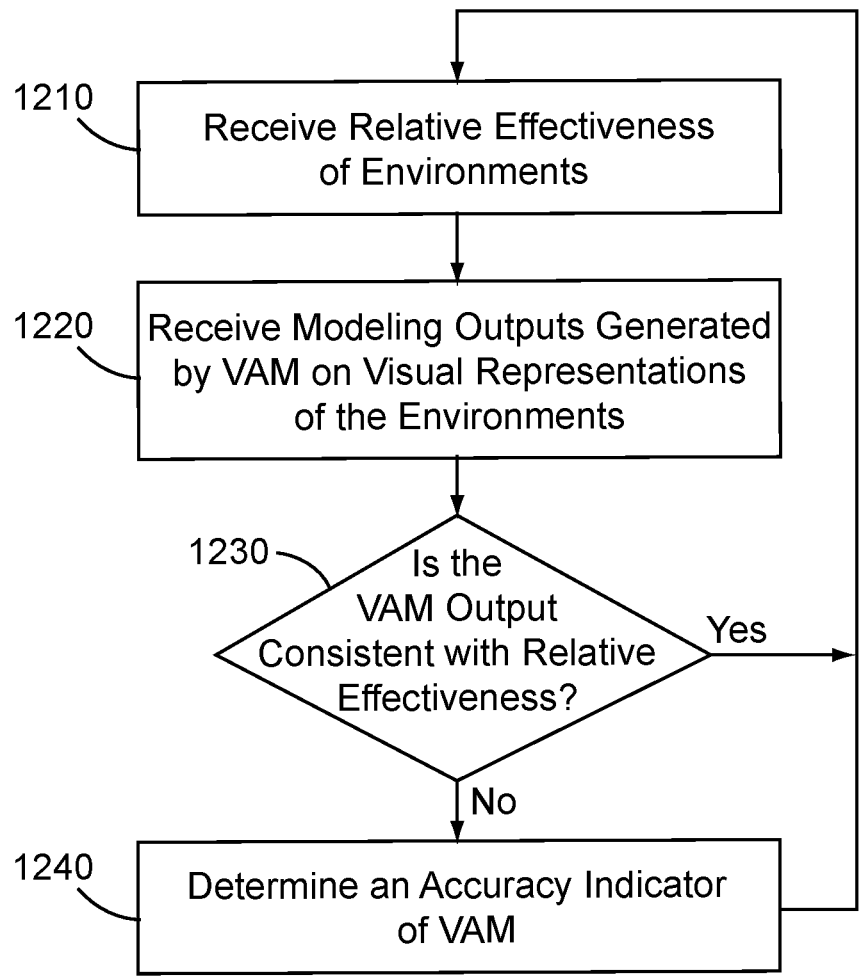
FIG. 12 shows an exemplary flowchart of a visual attention model accuracy analysis module.

VAM accuracy analysis module analyzes the modeling accuracy of a VAM based on feedback provided by the effective assessment module. FIG. 12 shows an exemplary flowchart of visual attention model (VAM) accuracy analysis module. First, receive relative effectiveness of one or more environments influencing a specified behavior (step 1210). Receive modeling outputs generated by applying a visual attention model to the visual representations of the one or more environments (step 1220). In some embodiments, the modeling outputs may be generated and stored in a data repository, and the VAM accuracy analysis module selects the modeling outputs from the data repository. The output of the VAM is compared with the relative effectiveness (step 1230). An accuracy indictor of VAM is determined based on the comparison (step 1240).

In one particular embodiment, a specified behavior is related to the likelihood an object or a region in the environment being attended. The modeling output for an object generated by a VAM may be quantified as a number, referred as relative saliency, for example, such as a saliency number that represents a relative saliency of an object or a region compared with others objects or regions, a sequence number that is the order in which a viewer will attend to an object or region compared with other objects or regions, or a probability number that is the probability of an object being attended within a given time, and the like. In an exemplary embodiment, a relative saliency of the object in each of the two environments is generated by the VAM. The ratio of the relative effectiveness of the two environments is compared with the ratio of relative saliency number of the object in the two environments, and an accuracy indicator is determined based on the comparison. For example, the accuracy indicator may be computed by an equation as:

$$\text{Accuracy Indicator} = \frac{\text{Effectiveness(environment }A)/\text{Effectiveness(environment }B)}{\text{Saliency(environment }A)/\text{Saliency(environment }A)},$$

where Saliency( ) is the relative saliency of the object, Effectiveness( ) is the relative effectiveness of an environment, and AccuracyIndicator is a computed indication of accuracy.

In some cases, the accuracy analysis may be based on data of assessed effectiveness from several sets of environments and modeling outputs generated by the VAM on those environments. Table 1 is an illustration accuracy indicator of six sets of environments that differ on edge, using the accuracy indicator equation above. The accuracy indicator of edge may be an average value of the six test results.

TABLE 1

| | Test 1 | Test 2 | Test 3 | Test 4 | Test 5 | Test 6 | Average |
|---|---|---|---|---|---|---|---|
| Accuracy Indicator | 0.798 | 0.934 | 0.743 | 0.702 | 0.894 | 0.632 | 0.7838 |

In some cases, an accuracy indicator may be an accuracy indicator vector, which may be generated based a set of experiments that each experiment is related to one or more visual dimensions of interest. For example, 3 sets of experiments are conducted: experiment 1 is related to luminance and edge, experiment 2 is related to motion, experiment 3 is related to color. The experiment results are illustrated in Table 2. An accuracy indicator vector [2.3 1.4 0.8 0.6] may be generated.

TABLE 2

| | Exp 1 | Ex 2 | Ex 3 |
|---|---|---|---|
| Luminance | 2.3 | | |
| Edge | 1.4 | | |
| Motion | | 0.8 | |
| Color | | | 0.6 |

In some embodiments, the VAM accuracy analysis module may use nonlinear algorithm to establish the correlation between the relative effectiveness of the environment and the relative saliency of the object of interest. In some cases, depending on the particular behavior being selected, the VAM accuracy analysis module may utilize a mathematical algorithm that fits to the relationship between the VAM output and the effectiveness assessment. As a simple example, the accuracy indicator may be computed use an equation below, $$\text{Accuracy Indicator} = \frac{\text{Effectiveness(environment }A)^2/\text{Effectiveness(environment }B)^2}{\text{Saliency(environment }A)/\text{Saliency(environment }A)}.$$

VAM Modification Module

VAM modification module modifies the VAM based on the result of the VAM accuracy analysis module. In an exemplary embodiment, the VAM modification module may add or change a weight factor related to a visual dimension represented in a VAM. In some cases, visual attention models may generate a saliency map by combining visual feature maps, as illustrated in flowcharts in FIG. 6 and FIG. 9. For example, three feature maps are generated on an input of visual representation of an environment: a first map sensitive to color, a second one to edge and a third one associated with luminance. A saliency map is generated based on a weighted combination of these three maps. Typically, these three maps have equal weights into the saliency map indicating that there is no bias for one type of feature over another and may be represented as a weighting vector (for example, [1 1 1] for an equal weight of the three feature maps). In an exemplary embodiment, the VAM modification module may modify these weights simulating a viewer that might be biased toward one feature over another. This may be accomplished through a function call that would modify these values based upon a distribution of acceptable values.

In some cases, the VAM modification module may use an accuracy indicator generated by the accuracy analysis module to modify a weight factor of a feature map related to a visual dimension. For example, the original weighting vector of a visual attention model is [1 1 1] corresponding to color, edge, and luminance. The VAM accuracy analysis module generates an accuracy indicator vector as [2 0.5 0.5]. The VAM modification module may modify the weighting vector of the VAM to [2 0.5 0.5] for the feature maps in color, edge, and luminance.

Finding parameters that minimize error between a function and the data are well known in the literature. Some of these approaches include optimization methods such as linear interpolation, genetic algorithms and simulated annealing. These methods may be used to identify the parameters that minimize the difference between the modeling output and the effectiveness assessment.

In some cases, a visual dimension, on which environments differing from each other, may not be represented in a visual attention model. If the output generated by the visual attention model is inconsistent with the relative effectiveness of the two environments, a parameter related to the visual dimension may be added to the VAM. For example, a visual attention model generating features maps sensitive to color, edge, and luminance, in the example given above, may add a feature map sensitive to orientation in generating the saliency map.

In some cases, a parameters set of a VAM may be stored in a data repository. For example, visual dimensions represented in a VAM and weighting factors associated with the visual dimensions may be stored in a data repository. In some other cases, a particular VAM may be associated with a particular human behavior in a data repository. In an exemplary embodiment, after a VAM is modified according to an accuracy analysis based on relative effectiveness of an environment on influencing a particular human behavior, the parameter set of the VAM may be stored in a data repository, and the VAM may be associated with the environment and the particular human behavior.

In one embodiment, environments differ on more than one visual dimension may be selected or designed. Visual representations of at least a portion of the environments may be generated or selected from a data repository as input to a visual attention model (VAM). Data indicative to a particular human behavior may be received from the environments, wherein the particular human behavior may be related to attention allocation. Relative effectiveness of the environments on influencing the particular human behavior may be assessed based on the received data. The relative effectiveness of the environments may be compared with modeling outputs generated by the VAM on the visual representations. The VAM may be modified according to the comparison result.

In some embodiments, environments may be classified into groups. Groups of environments may be classified by types of location, time of day, etc. For example, fast-food restaurants in suburban area are in a group and fast-food restaurants in rural area are in another group. As another example, a store or stores in a franchise chain in the morning is a group, the store or stores in the franchise chain in the afternoon is a group, and the store or stores in the franchise chain in the evening is another group. In some cases, a natural environment may be a group by itself, or a natural environment at a particular condition may be a group by itself. A group of environments may be associated with a particular VAM that may be different from a VAM associated with another group of environments. In some cases, the particular VAM may be associated with the group of environments and it may be stored in a data repository. Optionally, the particular VAM may be associated with the particular human behavior in the data repository.

In some cases, the visual attention improvement system may receive visual representations of at least a portion of one or more environments in a group of environments. A VAM may be applied on the visual representations and generate modeling outputs. In some cases, modeling outputs may be selected from a data repository, which stores modeling outputs generated by applying the VAM on the visual representations. Data indicative of a particular human behavior may be collected or measured from the one or more environments, while the particular human behavior may be related to visual attention allocation. The relative effectiveness of the environments on influencing the particular human behavior may be assessed based on the data. The visual attention model may be modified according to the comparison of the assessed relative effectiveness and the outputs generated by the visual attention model. In some cases, the modified visual attention model may be associated with the group of environments. In some other cases, the modified visual attention model may be associated with the particular human behavior.

In one particular embodiment, one or more environments with similar VAM outputs may be selected, while the one or more environments differ on a visual dimension. The relative effectiveness of the one or more environments is assessed based on collected data indicative of a specified behavior that is related to visual attention allocation. An accuracy indicator is determined by comparing the relative effectiveness with the VAM outputs. In some cases, a weight factor related to the visual dimension may be modified according to the accuracy indicator. In some cases, one or more environments selected or generated have similar semantic elements, for example, displays in the environments have similar textual messages.

In some embodiments, the visual attention model improvement system may be used to improve visual attention models used in an environment having a sign. A sign may provide identification, warning, direction, or other information. For example, a sign may be a traffic sign, a billboard, or a digital sign. A sign may have fixed content or changeable content. Here, an environment is a sign with its surrounding area. In some cases, visual representation of at least a portion of the environment may be digital photographs taken from the environment or video recording of the environment.

In one particular embodiment, the visual attention model improvement system may be used to improve visual attention models for digital signage systems. Here, an environment is a digital signage display with its surrounding area. A digital signage display may be a LCD display, a plasma TV, or other kinds of display. In some cases, a visual representation of at least a portion of an environment in a digital signage system may be generated by inserting the content on the signage display into an image of the surrounding area. In some other cases, a visual representation may be generated by a digital photograph. As another example, a visual representation may include several digital images of the surrounding area. In some cases, a visual representation may be selected from a data repository that, as an example, stores pieces of content presented on signage displays.

In some cases, a hybrid VAM may be used, which combines bottom-up features with top-down influences. In some cases, an environment is expected to influence people making a purchase, or purchasing a particular product. In some cases, point-of-sale data from the environment or the point-of-sale data for a particular product from the environment may be collected as indications of people making the purchase or purchasing the product. The sales data is usually obtained in a regular business process. In some cases, the sales data when the selected piece of content is displayed is selected from a data repository. For example, two environments are selected and the signage displays within the environments present an advertisement of a product. The sales data for the product from the two environments are collected. The sales data may be compared with the modeling output generated by the VAM. The modeling output may be generated by applying the VAM to the visual representations of the two environments. Alternatively, the modeling output may be selected from a data repository. In some cases, the modeling output may be the relative saliency represented by numbers. In some embodiment, the sales data is inconsistent with what the VAM output indicates, for example, the product has the same relative saliency in the two environments and the sales in one environment is higher than the sales in the other environment, the VAM may be modified.

Figure 13A:
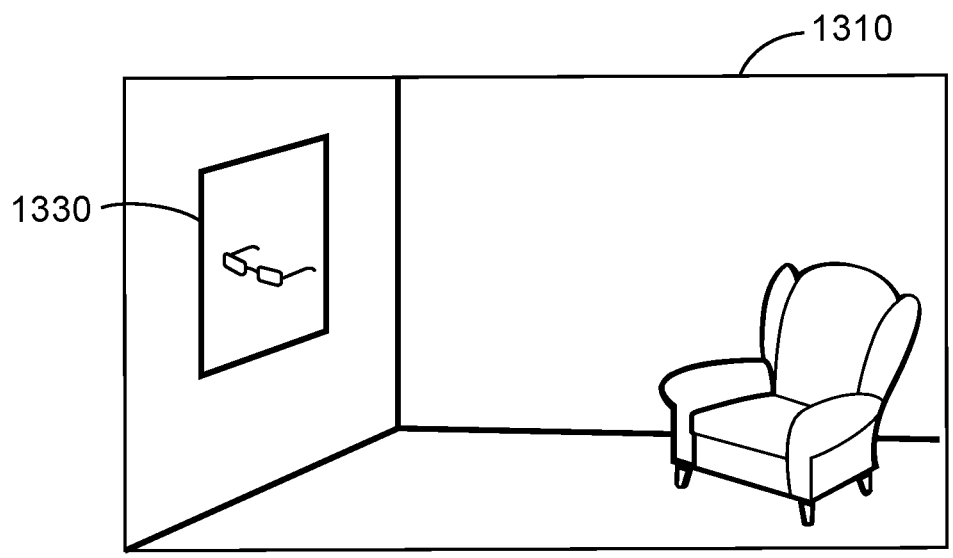
FIG. 13A and FIG. 13B illustrate two exemplary environments in a digital signage network.
Figure 13B:
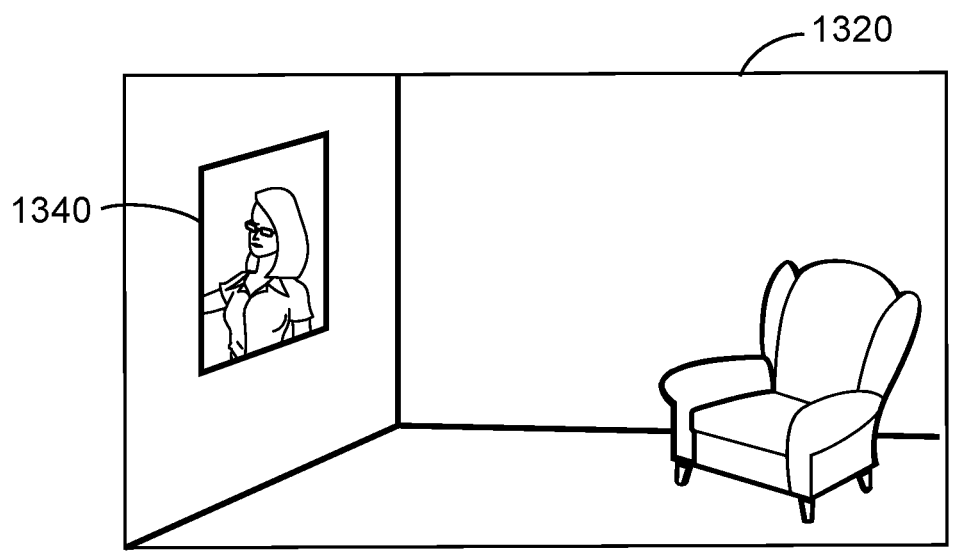

For example, a store has a digital signage display to present advertisements. Two environments may be the same store having the signage display presenting different content. The visual representations of at least a portion of two environments, as simplified examples, are shown in FIGS. 13A and 13B. One piece of content has a pair of sunglasses (as shown in 1310) and the other piece of content has a picture of a lady wearing a pair of sunglasses (as shown in 1320). A hybrid VAM is used in this example. The relative saliency of sunglasses in environment 1310 generated by the VAM is similar to the relative saliency in environment 1320. A store visitor's purchasing the sunglasses shown in the advertisement is related to whether the visitor seeing the advertisement. In this example, the sales data collected from environment 1310 (for example, when content 1330 is displayed) is lower than the sales data collected from environment 1320 (for example, when content 1340 is displayed). Accordingly, the relative effectiveness of environments 1310 and 1320 on influencing visitors' purchases the sunglasses is inconsistent with the modeling outputs generated by the VAM. A parameter related to 'face', for instance, may be adjusted or added in the VAM to improve the VAM accuracy.

In another particular embodiment, the visual attention model improvement system may be used to improve visual attention models for webpage designs. Here, an environment is a digital environment, and a visual representation of at least a portion of the environment may be, for example, an image of the webpage, or a set of visual parameters representing the webpage. In some cases, a webpage may be designed to promote viewers' awareness based on a specific piece of content on the webpage, for example, such as a piece of breaking news. The specific piece of content may have a hyperlink directed to a designated webpage, for example, such as a full story of a piece breaking news. The number of visit to the designated webpage directed from the piece of content may be used to indicate the viewers' awareness. In some cases, two environments may be designed with a same specific piece of content in two webpages, where the two webpages are different on a visual dimension. In some other cases, two environments may be two webpages with two pieces of content that differ from each other on a visual dimension. An accuracy indicator may be generated based on the comparison of the relative effectiveness of the two webpages with the modeling output generated by the VAM. The VAM may be modified according to the accuracy indicator.

Figure 14A:
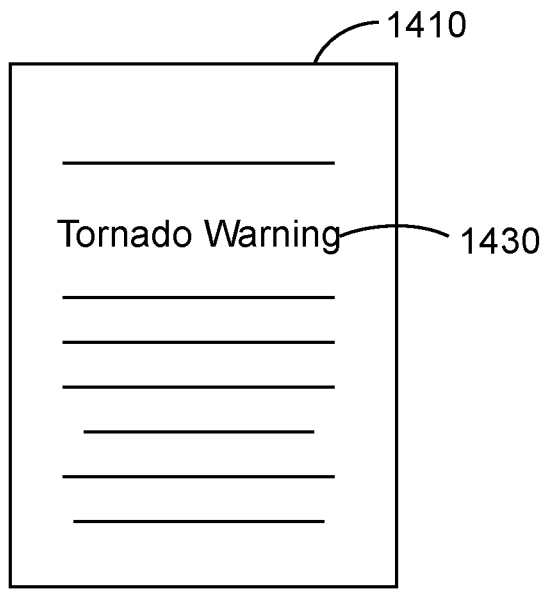
FIG. 14A and FIG. 14B illustrate two exemplary digital environments.
Figure 14B:
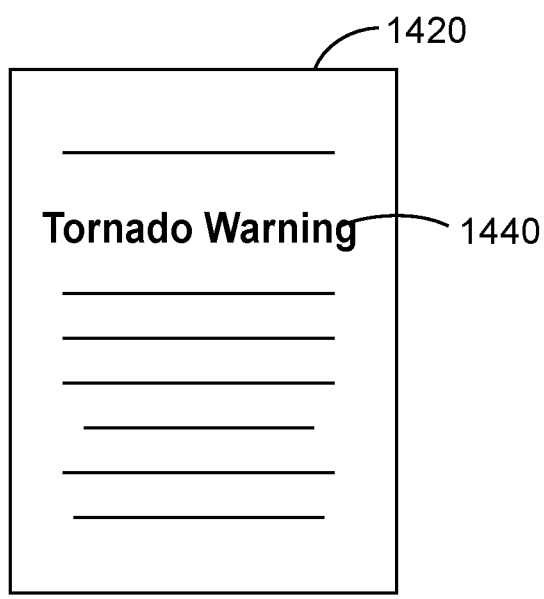

FIG. 14A and FIG. 14B illustrate two exemplary digital environments, for example, two webpages with a same piece of news. The font of the news on webpage 1410 is smaller than the font of the news on webpage 1420. The short message of the news links to a full story of the news at a separate webpage. The number of visits to the full story directed from a webpage containing the short message may be collected to indicate viewers' awareness, which is related to whether viewer has attended to the short message on the webpage. A bottom-up VAM may be used in this example. Applying the VAM to environment 1410 and 1420, the saliency of news message 1430 in environment 1410 is lower than the saliency of news message 1440 in environment 1420. However, the number of visits directed from environment 1410 and 1420 are similar, so the effectiveness of environment 1410 and environment 1420, on influencing viewers' awareness of the news, is similar. The VAM may be modified such that a consistent modeling output is generated. For example, a weight factor related to font size for a piece of news in webpage may be lowered.

A first embodiment is a visual attention model improvement system comprising a module for receiving visual representations of at least a portion of two environments that differ from each other on a visual dimension; a module for receiving output generated by applying the visual attention model on the visual representations of the at least a portion of the two environments; a module for assessing the relative effectiveness of the two environments on influencing a particular human behavior based on data indicative of the particular human behavior received from the two environments, wherein the particular human behavior is inferentially related to attention allocation; and a processing unit for comparing the assessed relative effectiveness to the output generated by the visual attention model.

A second embodiment is the visual attention model improvement system of the first embodiment further comprising the processing unit modifying the visual attention model when the assessed relative effectiveness is inconsistent with the output generated by the visual attention model.

A third embodiment is the visual attention model improvement system of the first embodiment or the second embodiment further comprising a module for storing parameters of the visual attention model in a data repository; and a module for associating the parameters of the visual attention model with the particular human behavior in the data repository.

A fourth embodiment is the visual attention model improvement system of the first embodiment, the second embodiment, or the third embodiment, wherein the particular human behavior is indirectly inferentially related to attention allocation.

A fifth embodiment is the visual attention model improvement system of the first embodiment, the second embodiment, or the third embodiment, wherein the data indicative of the particular human behavior comprises at least one of point-of-sale data and motion sensor data.

A sixth embodiment is the visual attention model improvement system of the first embodiment, the second embodiment, or the third embodiment, wherein the output generated by the visual attention model comprises at least one of a saliency map, saliency numbers, sequence numbers, and probability of a region being attended within a given time period.

A seventh embodiment is the visual attention model improvement system of the first embodiment, the second embodiment, or the third embodiment, further comprising a module for selecting two environments with similar output generated by the visual attention model on the visual representations of the at least a portion of the two environments.

An eighth embodiment is the visual attention model improvement system of the first embodiment, the second embodiment, or the third embodiment, wherein the visual dimension is represented in the visual attention model.

A ninth embodiment is the visual attention model improvement system of the eighth embodiment, wherein modifying the visual attention model comprises modifying a parameter of the visual attention model related to the visual dimension.

A tenth embodiment is the visual attention model improvement system of the ninth embodiment, wherein modifying a parameter of the visual attention model comprises modifying a weight factor for the visual dimension represented in the visual attention model.

An eleventh embodiment is the visual attention model improvement system of the first embodiment, the second embodiment, or the third embodiment, wherein modifying the visual attention model comprises adding a parameter related to the visual dimension to the visual attention model.

A twelfth embodiment is the visual attention model improvement system of the first embodiment, the second embodiment, or the third embodiment, wherein the visual dimension comprises at least one of color, luminance, orientation, font, edges, motion, faces, intensity, distance from fovea, spatial bias, prior-knowledge influence, and task-based influence.

A thirteenth embodiment is the visual attention model improvement system of the first embodiment, the second embodiment, or the third embodiment, wherein the two environments have similar semantic elements.

A fourteenth embodiment is the visual attention model improvement system of the first embodiment, the second embodiment, or the third embodiment, wherein the visual attention model is a hybrid visual attention model.

A fifteenth embodiment is a visual attention model improvement system comprising a module for receiving visual representation of at least a portion of an environment; a module for receiving output generated by applying the visual attention model on the visual representation of the at least a portion of the environment; a module for assessing the relative effectiveness of the environment on influencing the particular human behavior based on data indicative of a particular human behavior received from the environment, wherein the particular human behavior is inferentially related to attention allocation; and a processing unit for comparing the assessed relative effectiveness to the output generated by the visual attention model.

A sixteenth embodiment is the visual attention model improvement system of the fifteenth embodiment, wherein the processing unit modifies the visual attention model when the assessed relative effectiveness is inconsistent with the output generated by the visual attention model.

A seventeenth embodiment is the visual attention model improvement system of the first embodiment, wherein the environment is an environment having a sign.

An eighteenth embodiment is a system to modify a visual attention model for a group of environments, the system comprising a module for receiving visual representations of at least a portion of one or more environments in the group of environments; a module for receiving output generated by applying the visual attention model on the visual representations of the at least a portion of the one or more environments; a module for assessing the relative effectiveness of the one or more environments on influencing the particular human behavior based on data indicative of a particular human behavior received from the one or more environments, wherein the particular human behavior is inferentially related to attention allocation; and a processing unit for modifying the visual attention model according to the comparison between the assessed relative effectiveness and the output generated by the visual attention model, associating the modified visual attention model with the group of environments, and associating the modified visual attention model with the particular human behavior.

What is claimed is:

1. A computer system, comprising:
   a display device that is configured to display digital content;
   a database that is configured to store a visual attention model; and
   a server device that is coupled to the display device and the database in a networked computer environment and that is configured to:
   control, by the server device, the display device to display first digital content and to subsequently display second digital content that is different from, but has a common element with, the first digital content;
   based on data collected during display of the first digital content and the second digital content, determine, by the server device, that the first digital content is more effective than the second digital content in attracting human attention to the common element;
   write, by the server device to the database, a value of a parameter of the visual attention model;
   generate, by the server device and based on the parameter of the visual attention model being set to the value, by running the visual attention model an output that reflects that the first digital content is more effective than the second digital content in attracting human attention to the common element; and
   use, by the server device, the visual attention model to evaluate whether the first or second digital content is designed to effectively influence a specified behavior according to the output of the visual attention model.

2. The computer system of claim 1, wherein the server device is further configured to access the database to select the first digital content and the second digital content for display by the display device.

3. The computer system of claim 1, wherein the server device is further configured to access the database to access the data collected during display of the first digital content and the second digital content in order to determine the first digital content is more effective than the second digital content in attracting human attention to the common element.

4. The computer system of claim 1, wherein the first digital content and the second digital content differ on a visual dimension that comprises at least one of color, luminance, orientation, font, edges, motion, faces, intensity, distance from fovea, spatial bias, prior-knowledge influence, and task-based influence.

5. The computer system of claim 1, wherein the first digital content and the second digital content each represent an advertisement for the common element.

6. The computer system of claim 1, wherein the common element is a product, the first and second digital content are each advertisements for the product, and the server device is configured to use, by the server device, the visual attention model to evaluate whether the first or second digital content is designed to effectively influence purchase of the product.

7. A computer system, comprising:
   a memory configured to store instructions; and
   a processor coupled to the memory and configured to execute instructions stored on the memory to cause the computer system to:
   access, by the processor, visual representations of at least a portion of two environments that differ from each other on a visual dimension,
   generate output, by the processor, by applying the visual attention model on the visual representations of the at least a portion of the two environments,
   assess, by the processor, the relative effectiveness of the two environments on influencing a particular human behavior based on data indicative of the particular human behavior received from the two environments, wherein the particular human behavior is inferentially related to attention allocation,
   modify, by the processor, the visual attention model based on the assessed relative effectiveness as compared to the output generated by the visual attention model, and
   use, by the processor, the visual attention model to evaluate whether at least one of the two environments is designed to effectively influence the particular human behavior according to the output of the visual attention model.

8. The computer system of claim 7, wherein the processor is further configured to execute instructions stored on the memory to cause the computer system to modify the visual attention model when the assessed relative effectiveness is inconsistent with the output generated by the visual attention model.

9. The computer system of claim 7, wherein the particular human behavior is indirectly inferentially related to attention allocation.

10. The computer system of claim 7, wherein the data indicative of the particular human behavior comprises at least one of point-of-sale data and motion sensor data.

11. The computer system of claim 7, wherein output generated by the visual attention model comprises at least one of a saliency map, saliency numbers, sequence numbers, and probability of a region being attended within a given time period.

12. The computer system of claim 7, wherein the processor is further configured to execute instructions stored on the memory to cause the system to select two environments with similar output generated by the visual attention model based on the visual representations of the at least a portion of the two environments.

13. The computer system of claim 7, wherein the visual dimension is represented in the visual attention model.

14. The computer system of claim 13, wherein as part of causing the computer system to modify the visual attention model, execution of the instructions causes the computer system to modify a parameter of the visual attention model related to the visual dimension.

15. The computer system of claim 14, wherein as part of causing the computer system to modify the parameter of the visual attention model, execution of the instructions causes the computer system to modify a weight factor for the visual dimension represented in the visual attention model.

16. The computer system of claim 13, wherein as part of causing the computer system to modify the parameter of the visual attention model, execution of the instructions causes the computer system to add a parameter related to the visual dimension to the visual attention model.

17. The computer system of claim 7, wherein the visual dimension comprises at least one of color, luminance, orientation, font, edges, motion, faces, intensity, distance from fovea, spatial bias, prior-knowledge influence, and task-based influence.

18. The computer system of claim 7, wherein the two environments have similar semantic elements.

19. The computer system of claim 7, wherein the visual attention model is a hybrid visual attention model.

20. The computer system of claim 7, wherein the processor is further configured to execute instructions stored on the memory to cause the system to store parameters of the visual attention model in a data repository and associate the parameters of the visual attention model with the particular human behavior in the data repository.

21. The computer system of claim 7, wherein the two environments are each webpages with a link to a same website, and the computer system is caused to use, by the processor, the visual attention model to evaluate whether at least one of the two environments is designed to effectively influence viewers to go to the website from the webpages.

22. A computer system, comprising:
a memory configured to store instructions; and
a processor coupled to the memory and configured to execute instructions stored on the memory to cause the computer system to:
  access, by the processor, data associated with a visual representation of a piece of digital content in a first digital signage environment and data associated with a visual representation of a piece of digital content in a second digital signage environment, wherein the piece of digital content in the first digital signage environment and the piece of digital content in the second digital signage environment differ from each other on a visual dimension;
  generate, by the processor, first quantitative output data that represents theoretical saliency of the piece of digital content in the first digital signage environment by running the visual attention model with an input of the data associated with the visual representation of the first digital signage environment, and second quantitative output data that represents theoretical saliency of the piece of digital content in the second digital signage environment by running the visual attention model with an input of the data associated with the visual representation of the second digital signage environment;
  collect, by the processor, first quantitative activity data that represents actual saliency of the piece of digital content in the first digital signage environment from monitoring human attention to the piece of digital content in the first digital signage environment, and second quantitative activity data that represents actual saliency of the piece of digital content in the second digital signage environment from monitoring human attention to the piece of digital content in the second digital signage environment;
  evaluate, by the processor, the visual attention model by comparing the first quantitative output data against the second quantitative output data, and the first quantitative activity data against the second quantitative activity data, to determine an effective saliency of the piece of digital content in the first digital signage environment and an effective saliency of the piece of digital content in the second digital signage environment;
  modify, by the processor, a parameter of the visual attention model to force the visual attention model to generate quantitative output data to reflect that the effective saliency of the piece of digital content in the first digital signage environment is greater than the effective saliency of the piece of digital content in the second digital signage environment or to reflect that the effective saliency of the piece of digital content in the second digital signage environment is greater than the effective saliency of the piece of digital content in the first digital signage environment; and
  use, by the processor, the visual attention model to evaluate whether the first or second digital signage environment is designed to effectively influence a specified behavior according to the output of the visual attention model.

* * * * *